(12) United States Patent
Yoshimura et al.

(10) Patent No.: US 11,081,359 B2
(45) Date of Patent: Aug. 3, 2021

(54) METHODS FOR POLISHING SEMICONDUCTOR SUBSTRATES THAT ADJUST FOR PAD-TO-PAD VARIANCE

(71) Applicant: GLOBALWAFERS CO., LTD., Hsinchu (TW)

(72) Inventors: Ichiro Yoshimura, Shimotsuke (JP); Alex Chu, HsinChu (TW); H. J. Chiu, Taoyuan (TW); Sumeet Bhagavat, St. Charles, MO (US); TaeHyeong Kim, Cheonan (KR); Norimasa Katakura, Sakado (JP); Masaru Kitazawa, Tochigi (JP)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 16/548,429

(22) Filed: Aug. 22, 2019

(65) Prior Publication Data
US 2020/0083057 A1    Mar. 12, 2020

Related U.S. Application Data

(60) Provisional application No. 62/729,134, filed on Sep. 10, 2018.

(51) Int. Cl.
| | | |
|---|---|---|
| *H01L 21/304* | (2006.01) | |
| *B24B 37/005* | (2012.01) | |
| *H01L 21/463* | (2006.01) | |
| *B24B 49/03* | (2006.01) | |
| *H01L 21/02* | (2006.01) | |

(Continued)

(52) U.S. Cl.
CPC .......... *H01L 21/304* (2013.01); *B24B 37/005* (2013.01); *B24B 49/03* (2013.01); *G01N 21/9503* (2013.01); *H01L 21/02021* (2013.01); *H01L 21/02024* (2013.01); *H01L 21/463* (2013.01); *H01L 21/30625* (2013.01)

(58) Field of Classification Search
CPC ............ H01L 21/304; H01L 21/30625; H01L 21/463; H01L 21/02024; H01L 21/02021; B24B 37/005; B24B 37/20; B24B 49/03; B24B 49/04; B24B 9/065
See application file for complete search history.

(56) References Cited

U.S. PATENT DOCUMENTS

| | | |
|---|---|---|
| 6,682,405 B2 | 1/2004 | Shimokawa |
| 6,878,302 B1 | 4/2005 | Corbellini et al. |

(Continued)

FOREIGN PATENT DOCUMENTS

| | | | |
|---|---|---|---|
| CN | 102189469 A | * | 9/2011 |
| CN | 105081957 A | * | 11/2015 |

(Continued)

OTHER PUBLICATIONS

"SEMI M69-0307 (Preliminary) Practice for Determining Wafer Near-Edge Geometry Using Roll-Off Amount, ROA", Jan. 18, 2007, 9 pages.

(Continued)

*Primary Examiner* — Anita K Alanko
(74) *Attorney, Agent, or Firm* — Armstrong Teasdale LLP

(57) ABSTRACT

Methods for polishing semiconductor substrates that involve adjusting the finish polishing sequence based on the pad-to-pad variance of the polishing pad are disclosed.

17 Claims, 8 Drawing Sheets

(51) Int. Cl.
*G01N 21/95* (2006.01)
*H01L 21/306* (2006.01)

(56) References Cited

U.S. PATENT DOCUMENTS

| | | | |
|---|---|---|---|
| 7,150,675 B2* | 12/2006 | Kramer | B24B 49/10 |
| | | | 451/8 |
| 7,220,676 B2 | 5/2007 | Hagihara et al. | |
| 10,600,634 B2* | 3/2020 | Chu | H01L 22/20 |
| 2005/0124264 A1* | 6/2005 | Tominaga | B24B 37/08 |
| | | | 451/41 |
| 2006/0262641 A1 | 11/2006 | Seong et al. | |
| 2007/0175104 A1 | 8/2007 | Nishiyama et al. | |
| 2009/0223136 A1 | 9/2009 | Nakajo et al. | |
| 2009/0298399 A1 | 12/2009 | Albrecht et al. | |
| 2010/0081361 A1 | 4/2010 | Fukuda et al. | |
| 2013/0023186 A1 | 1/2013 | Motoshima et al. | |
| 2014/0015107 A1* | 1/2014 | Chen | B24B 37/015 |
| | | | 257/618 |
| 2014/0162456 A1 | 6/2014 | Oba et al. | |
| 2014/0206261 A1 | 7/2014 | Roettger et al. | |
| 2014/0273748 A1 | 9/2014 | Bhagavat et al. | |
| 2017/0178890 A1* | 6/2017 | Chu | B24B 37/20 |
| 2019/0143475 A1* | 5/2019 | Dhandapani | B24B 37/20 |
| | | | 451/5 |

FOREIGN PATENT DOCUMENTS

| | | |
|---|---|---|
| EP | 1489649 A1 | 12/2004 |
| JP | 2007053298 A | 3/2007 |
| JP | 2008279553 A | 11/2008 |
| JP | 5450946 B2 | 3/2014 |
| JP | 2018114582 A | 7/2018 |
| KR | 2004056177 A | 6/2004 |
| KR | 20080062020 A | 7/2008 |
| WO | 2016060872 A2 | 4/2016 |

OTHER PUBLICATIONS

Kimura et al, A New Method for the Precise Measurement of Wafer Roll off of Silicon Polished Wafer, Nov. 6, 1998, pp. 38-39.

* cited by examiner

METHODS FOR POLISHING SEMICONDUCTOR SUBSTRATES THAT ADJUST FOR PAD-TO-PAD VARIANCE

CROSS-REFERENCE TO RELATED APPLICATION

This application claims the benefit of U.S. Provisional Patent Application No. 62/729,134, filed Sep. 10, 2018, which is incorporated herein by reference in its entirety.

FIELD OF THE DISCLOSURE

The field of the disclosure relates to methods for polishing semiconductor substrates and, in particular, methods that involve adjusting the finish polishing sequence based on the pad-to-pad variance of the polishing pad.

BACKGROUND

Semiconductor wafers are commonly used in the production of integrated circuit (IC) chips on which circuitry are printed. The circuitry is first printed in miniaturized form onto surfaces of the wafers. The wafers are then broken into circuit chips. This miniaturized circuitry requires that front and back surfaces of each wafer be extremely flat and parallel to ensure that the circuitry can be properly printed over the entire surface of the wafer. To accomplish this, grinding and polishing processes are commonly used to improve flatness and parallelism of the front and back surfaces of the wafer after the wafer is cut from an ingot. A particularly good finish is required when polishing the wafer in preparation for printing the miniaturized circuits on the wafer by an electron beam-lithographic or photolithographic process. The wafer surface on which the miniaturized circuits are to be printed should be flat.

Polishing processes may cause the profile of the semiconductor wafer to change near the edge of the structure due to an uneven distribution of mechanical and/or chemical forces near the edge. For example, the thickness profile at the peripheral edge of the structure may be reduced, i.e., "edge roll-off" may be observed. Edge roll-off reduces the portion of the wafer available for device fabrication. While edge roll-off may be controlled through dynamic control methods as disclosed in U.S. Patent Publication No. 2017/0178890, variability between polishing pads may cause differences in the edge roll-off of polished substrates. Such variability may result from allowed tolerances within the manufacturing process and may result from variation in pad compressibility and/or thickness.

There is a need for methods for polishing semiconductor substrates that improve substrate flatness and/or surface roughness while minimizing edge roll-off while offsetting changes in edge roll-off that may be attributed to pad-to-pad variability.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for polishing semiconductor substrates. Each substrate has a front surface and a back surface generally parallel to the front surface. The front surface of a first semiconductor substrate is contacted with a polishing pad. A polishing slurry is supplied to the polishing pad to polish the front surface of the first semiconductor substrate and produce a polished first semiconductor substrate. The edge roll-off of the first semiconductor substrate is measured. The front surface of a second semiconductor substrate is contacted with the polishing pad. A polishing slurry is supplied to the polishing pad to polish the front surface of the second semiconductor substrate. An amount of the polishing slurry supplied to the polishing pad while contacting the second semiconductor substrate with the polishing pad is controlled based on, at least in part, the measured edge roll-off of the first semiconductor substrate.

Another aspect of the present disclosure is directed to a method for finish-polishing semiconductor substrates. Each substrate has a front surface and a back surface generally parallel to the front surface. The lifetime of a polishing pad is determined. Only the front surface of a semiconductor substrate is contacted with the polishing pad. A polishing slurry is supplied to the polishing pad to polish the front surface of the semiconductor substrate and produce a polished semiconductor substrate. An amount of the polishing slurry supplied to the polishing pad while contacting the semiconductor substrate with the polishing pad is controlled based on, at least in part, the lifetime of the polishing pad.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
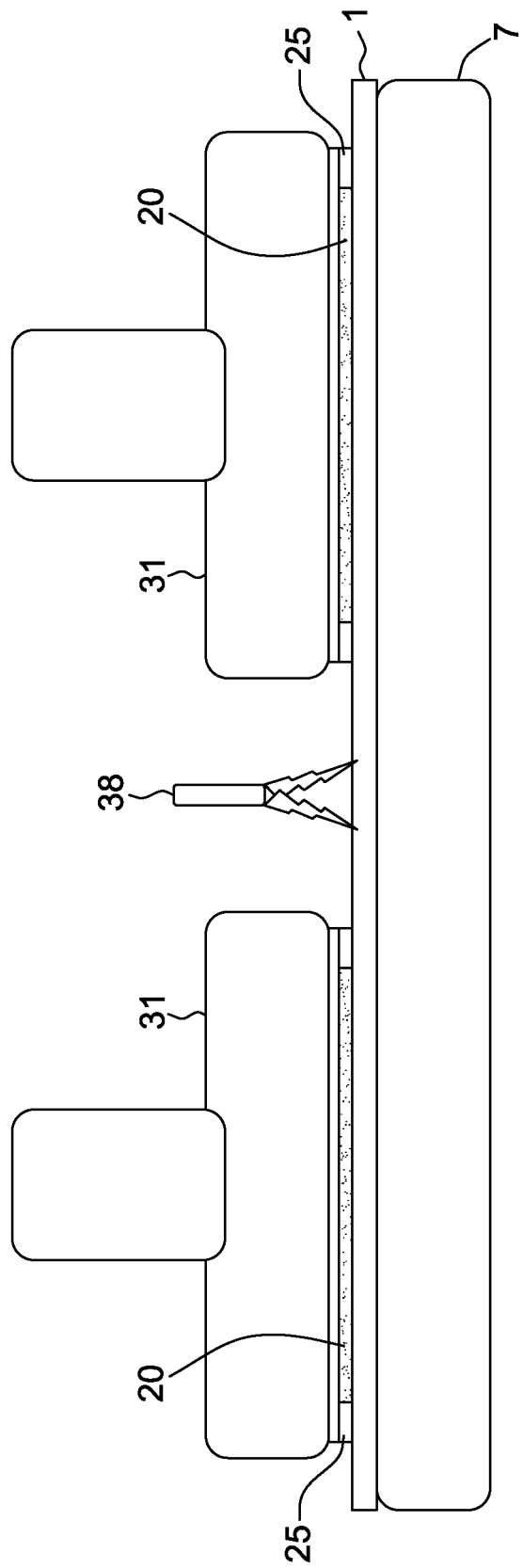
FIG. 1 is a schematic of a finish polishing apparatus.

Provisions of the present disclosure relate to methods for polishing semiconductor substrates. Suitable substrates (which may also be referenced herein as semiconductor "wafers" or "structures") include single crystal silicon substrates including substrates obtained by slicing the wafers from ingots formed by the Czochralski process. Each substrate includes a central axis, a front surface and a back surface parallel to the front surface. The front and back surfaces are generally perpendicular to the central axis. A circumferential edge joins the front and back surfaces and a radius extends from the central axis to the circumferential edge. The structures polished according to methods of the present disclosure may be any diameter suitable for use by those of skill in the art including, for example, 200 mm, 300 mm, greater than 300 mm or even 450 mm diameter wafers.

In one or more embodiments of the present disclosure, a semiconductor substrate is polished (e.g., finish polished) and the polished semiconductor substrate is analyzed to determine the edge roll-off. The edge roll-off is used to determine the pad-to-pad variance of the pad (i.e., deviation from an average roll-off of pads of the same type). The polishing process may be adjusted based on, at least in part, the measured edge roll-off. In some embodiments, a batch of semiconductor structures is polished and the measured edge roll-off of the batch of wafers is used to adjust the polishing sequence.

In one or more embodiments of the present disclosure, the semiconductor substrate may be polished in one or more steps before the pad-to-pad variance of one of the pads used in the polishing sequence is determined. For example, in some embodiments, a first polishing step is performed in which the front surface and optionally the back surface of the structure are polished (i.e., a double-side polish is performed). Generally, the polish is a "rough" polish that reduces the surface roughness of the wafer to less than about 3.5 Å to even as low as about 2.5 Å or even about 2 Å as measured with an atomic force microscope (AFM) at scan sizes of about 1 μm×about 1 μm to about 100 μm×about 100 μm. For purposes of this specification, surface roughness is expressed as the root mean square (RMS) unless indicated otherwise. Rough polishing typically results in removal of about 1 μm to about 20 μm and, more typically, from about 5 μm to about 15 μm of material from the surface of the wafer.

The rough polish (and the finish polish described below) may be achieved by, for example, chemical-mechanical planarization (CMP). CMP typically involves the immersion of the wafer in an abrasive slurry and polishing of the wafer by a polymeric pad. Through a combination of chemical and mechanical action the surface of the wafer is smoothed. Typically the polish is performed until a chemical and thermal steady state is achieved and until the wafers have achieved their targeted shape and flatness. The rough polish may be performed on a double-side polisher commercially available from Peter Wolters (e.g., AC2000 polisher; Rendsburg, Germany) or Fujikoshi (Tokyo, Japan), Speedfam (Kanagawa, Japan). Stock removal pads for silicon polishing are available from Psiloquest (Orlando, Fla.) and Dow Chemical Company (Midland, Mich.) and silica based slurries may be purchased from Dow Chemical Company, Cabot (Boston, Mass.), Nalco (Naperville, Ill.), Bayer MaterialScience (Leverkusen, Germany), DA NanoMaterials (Tempe, Ariz.) and Fujimi (Kiyoso, Japan).

The rough polishing step may occur for about 300 seconds to about 60 minutes and at a pad pressure of from about 150 g/cm$^2$ to about 700 g/cm$^2$ with a slurry flow rate of about 50 ml/min to about 300 ml/min (or from about 75 ml/min to about 125 ml/min). However, it should be understood that other polish times, pad pressures and slurry flow rates may be used without departing from the scope of the present disclosure.

After the rough polish is complete, the wafers may be rinsed and dried. In addition, the wafers may be subjected to a wet bench or spin cleaning. Wet bench cleaning may include contacting the wafers with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

After cleaning, a second polishing step may be performed. The second polishing step is typically a "finish" or "mirror" polish in which the front surface of the substrate is contacted with a polishing pad attached to a turntable or platen. The finish polish reduces the surface roughness of the wafer to less than about 2.0 Å as measured by an AFM at scan sizes of about 10 μm×about 10 μm to about 100 μm×about 100 μm. The finish polish may even reduce the surface roughness to less than about 1.5 Å or less than about 1.2 Å at scan sizes of about 10 μm×about 10 μm to about 100 μm×about 100 μm. Finish polishes typically remove only about 0.5 μm or less of material from the surface.

With reference to FIG. 1, suitable finish polishing apparatus may include a polishing pad 1 that is mounted to a polishing table 7. Polishing heads 31 hold substrates 20 by use of retainers 25 such that the front surfaces of the substrates 20 contact the pad 1. Slurry 38 is supplied to the polishing pad 1. The polishing head 31 oscillates at high speed to move the substrates 20 relative to the pad 1 to polish the front surfaces of the substrates.

Suitable polishers for finish polishing may be obtained from Lapmaster SFT (e.g., LGP-708, Chiyoda-Ku, Japan). Suitable pads include polyurethane impregnated polyethylene pads such as SUBA pads available from Dow Chemical Company, suede-type pads (also referred to as a polyurethane foam pad) such as a SURFIN pad from Fujimi, a CIEGAL pad from Chiyoda KK (Osaka, Japan) and a SPM pad from Dow Chemical Company.

The finish polish (i.e., first table of the finish polish) may occur for at least about 60 seconds or even about 90, 120 or 180 seconds. The total slurry flow rate may range from about 500 ml/min to about 1000 ml/min (total as mixed) and the pad pressure may range from about 60 g/cm$^2$ to about 200 g/cm$^2$; however, it should be understood that other polish times, pad pressures and slurry flow rates may be used without departing from the scope of the present disclosure.

The finish polish may involve several polishing steps. For example, the structure may be exposed to several separate polishing sequences at two or more tables of a finish polisher (i.e., different workstations at which a different polishing pad is used). The polishing slurry supplied to the polishing pad at a table may also be varied during a polishing sequence.

One or more polishing slurries may be supplied to the polishing pad at various sequences at the first table (i.e., first polishing pad) of the polishing apparatus. In accordance with embodiments of the present disclosure, suitable slurries that may be used alone or in combination in the polishing sequences include a first polishing slurry comprising an amount of silica particles, a second polishing slurry also comprising an amount of silica particles but at a concentration less than the first slurry, a third polishing slurry that is alkaline (i.e., caustic) and typically does not contain silica particles and a fourth polishing slurry that is deionized water. In this regard, it should be noted that the term "slurry" as referenced herein denotes various suspensions and solutions (including solutions without particles therein such as caustic solution and deionized water) and is not intended to imply the presence of particles in the liquid.

The silica particles of the first and second slurries may be colloidal silica and the particles may be encapsulated in a polymer. Suitable first silica-containing polishing slurries include Syton-HT50 (Du Pont Air Products NanoMaterials; Tempe, Ariz.) and DVSTS029 (Nalco Water; St. Paul, Minn.). Suitable second silica-containing polishing slurries include Glanzox-3018 from (Fujimi; Tokyo, Japan) and NP 8020 (Nitta Haas; Osaka, Japan).

The concentration of silica in the first and second polishing slurries may be varied by using less of silica particles in the second slurry. More typically, the concentration is varied by using silica particles that include less silica in the particles themselves (i.e., more polymer encapsulation and less silica).

In some embodiments, the first polishing slurry contains a first set of silica particles and the second slurry contains a second set of silica particles. The first set of silica particles has a silica content of $X_1$ and the second set has a silica content of $X_2$ with $X_1$ being greater than $X_2$. The silica content of the particles may be varied by individually encapsulating the particles of at least one set with a polymer with the degree of encapsulation (i.e., thickness of polymer) being different between the two sets. The polymer reduces the silica content within the set of particles. In some embodiments, the ratio of $X_1$ to about $X_2$ is at least about 2:1 or even at least about 3:1, at least about 5:1, at least about 10:1 or even at least about 15:1. The difference between $X_1$ and about $X_2$ (i.e., $X_1$ minus $X_2$) may be about 5 wt %, at least about 10 wt %, at least about 25 wt % or at least about 50 wt %.

In some embodiments, the silica particles of the first set of the first polishing slurry are individually encapsulated in a polymer and the first set includes at least about 50 wt % silica or at least about 60 wt %, at least about 70 wt %, from about 50 wt % to about 95 wt %, from about 60 wt % to about 95 wt % or from about 70 wt % to about 90 wt % silica.

The second set of silica particles of the second polishing slurry may also be individually polymer encapsulated. The second set of polymer-encapsulated silica particles may comprise less than about 25 wt % silica or, as in other embodiments, less than about 15 wt %, less than about 10 wt %, from about 1 wt % to about 25 wt %, from about 1 wt % to about 15 wt % or from about 1 wt % to about 10 wt % silica.

The third polishing slurry is alkaline (e.g., comprises KOH, NaOH or a $NH_4$ salt) and, typically, does not contain silica particles. The slurry may have a pH of greater than 12 (e.g., a pH from about 13 to about 14).

The first, second, third and fourth polishing slurries may be applied alone or in various combinations in various polishing sequences. In an exemplary sequence and according to some embodiments of the present disclosure, finish polishing at the first table of the finish polisher begins with a first finish polishing step in which the polishing pad is concurrently contacted with the first polishing slurry comprising silica and the third polishing slurry which is alkaline. The two slurries may be combined at the polisher (i.e., supplied separately at the pad) or may be mixed before being supplied to the pad.

In a second finish polishing step of the first table, the second silica-containing polishing slurry and the third alkaline polishing slurry are concurrently supplied to the polishing pad. The fourth slurry comprising deionized water may be used in addition or as an alternative to the third slurry that is alkaline in the second step. Generally, the second polishing slurry is supplied to the pad only after the first polishing slurry has been fully supplied in the first step.

In a third finish polishing step of the first table, the second polishing slurry comprising silica particles and/or the fourth polishing slurry comprising deionized water are supplied to the polishing pad. Generally, the third slurry does not include alkaline to prevent the formation of etching pits.

After the polishing sequences of the first table are complete, the semiconductor substrate may be transferred to a second or even a third table. The second and third tables may include the same or different polishing pads than that of the first table. The second polishing slurry that has a lower concentration of silica than the first slurry and/or the fourth slurry comprising deionized water may be used at the second and third tables.

In accordance with embodiments of the present disclosure, a substrate or a batch of substrates that have been polished (e.g., finish polished) is analyzed by measuring the edge roll-off of the structure to provide feedback to adjust the polishing sequence (e.g., sequence of the first table) of the finish polisher. The polished substrate is analyzed to determine the edge roll-off (also referred to as "roll-off amount" or simply "ROA").

Edge roll-off may be measured using the height data profile as disclosed by M. Kimura et al., "A New Method for the Precise Measurement of Wafer Roll off of Silicon Polished Wafer," *Jpn. Jo. Appl. Phys.*, vol. 38, pp. 38-39 (1999), which is incorporated herein by reference for all relevant and consistent purposes. Generally, the methods of Kimura have been standardized by the industry as by, for example, SEMI M69: Practice for Determining Wafer Near-Edge Geometry using Roll-off Amount, ROA (Preliminary) (2007) which is also incorporated herein by reference for all relevant and consistent purposes. Most commercially available wafer-inspection instruments are pre-programmed to calculate ROA. For instance ROA may be determined by use of a KLA-Tencor Wafer Inspection System using Wafer-Sight analysis hardware (Milpitas, Calif.).

Figure 2:
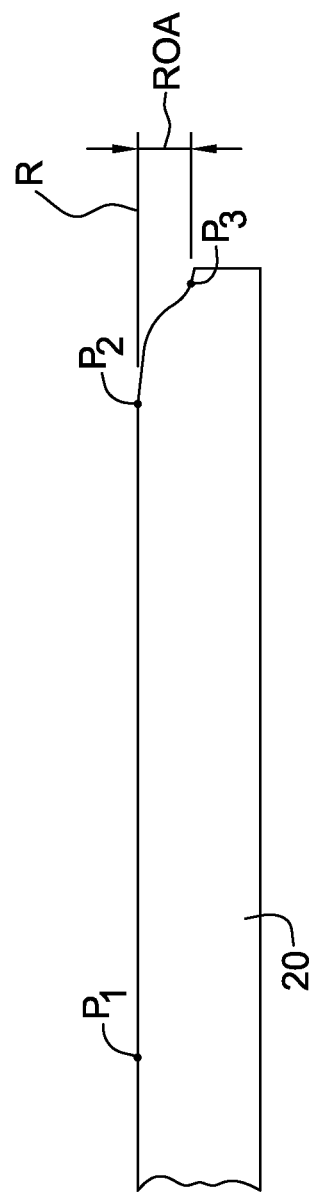
FIG. 2 is a cross-section view of a wafer schematically showing measurement of the roll-off amount.

With reference to FIG. 2, ROA of a wafer 20 is generally determined by reference to three points ($P_1$, $P_2$ and $P_3$) along a wafer radius. A reference line R is fitted between two points ($P_1$, $P_2$). The third point ($P_3$) is near the circumferential edge of the wafer where roll-off is conventionally observed. The ROA is the distance between the reference line R and the third point $P_3$. The reference line R may be fitted as a first order linear line or a third order polynomial. For purposes of the present disclosure, the reference line is fitted as a first order linear line unless stated differently.

In this regard, ROA may be expressed in terms of front surface ROA, back surface ROA or thickness ROA (i.e., using an average thickness profile). Front surface ROA and back surface ROA measurements involve fitting a best-fit reference line R between $P_1$ and $P_2$ along the respective front or back surface and thickness ROA involves fitting a best fit line for the various wafer 20 thicknesses between $P_1$ and $P_2$ (i.e., the thickness ROA takes into account both the front and back surface).

While any of three points may be chosen to determine ROA, one common method used in the art, particularly for 300 mm substrates, includes using a first point that is about 80% of the radius of the wafer from the central axis of the wafer and a second point that is about 93.3% of the radius from the central axis of the wafer to form the reference line R. These points are about 120 mm and 140 mm from the central axis of the wafer in a 300 mm diameter wafer. A third point about 98.7% of the radius of the wafer from the central axis (i.e., at about 148 mm from the central axis for a 300 mm diameter wafer) may be used with the distance between the reference line and the third point being ROA. The ROA may also be determined using a third point that is about 98.0% of the radius of the wafer from the central axis or about 99.3% of the radius of the wafer from the central axis (about 147 mm and about 149 mm respective for 300 mm diameter wafers).

ROA may be measured across several radii of the wafer and averaged. For instance, the ROA of 2, 4 or 8 radii angularly spaced across the wafer may be measured and averaged. For instance, ROA may be measured by averaging the ROA of eight radii (e.g., the eight radii at 0°, 45°, 90°, 135°, 180°, 225°, 275° and 315° in the R-θ coordinate system as described in SEMI M69).

As described above, the ROA measurement may involve the front surface profile, back surface profile or thickness profile. In this regard, "ROA" as used herein refers to the ROA measured by use of the best-fit thickness profile (i.e., thickness ROA rather than a front surface ROA) of the wafer with a linear first order line being established between 80% and 93.3% of the radius of the wafer and with the reference point in the annular edge portion of the wafer being at 98.7% of the radius, unless stated otherwise.

It should be understood that ROA, in regard to the thickness profile, may be a positive number in which the wafer becomes thicker in its peripheral edge portion or may be a negative number in which the wafer becomes less thick in its peripheral edge portion. In this regard, use of the phrase "less than" herein in relation to an ROA amount (either negative or positive) indicates that the ROA is in a range from the recited amount to about 0 (e.g., an ROA of "less than about −700 nm" refers to an ROA range of about −700 nm to about 0 and an ROA of "less than about 700 nm" refers to an ROA in the range of about 700 nm to about 0). Additionally, use of the phrase "greater than" in relation to an ROA amount (either negative or positive) includes roll-off amounts in which the edge portion of the wafer is further away from the axial center of the wafer than the recited amount.

It should also be noted that reference to a "delta ROA/ERO" (see FIGS. 4 and 6) references the change in ROA from a previous process condition. For negative ROA's (e.g., −700 nm) in which fall-off is observed at the edge, a positive delta ROA/ERO indicates an improvement in the edge roll-off (i.e., the edge did not fall off as much) in the changed condition while a negative delta ROA/ERO indicates additional fall-off at the edge. For positive ROA's (e.g., 700 nm) in which an up-tick is observed at the edge, a positive delta ROA/ERO indicates a further uptick at the edge for the changed condition while a negative delta ROA indicates less of an uptick at the edge for the changed condition.

In some embodiments, one or more (e.g., a batch) of semiconductor substrates are analyzed after a new polishing pad is installed. The edge roll-off of the polished semiconductor substrate is used to determine the pad-to-pad variance of the pad (e.g., the variation from an "average" edge roll-off). The measured edge roll-off of the polished semiconductor substrate (which may be referred to herein as "first" semiconductor substrate) or batch of substrates is used to adjust the polishing sequence of the first table of the finish polisher for subsequently polished substrates (which may be referred to herein as a "second" semiconductor substrate). For example, the amount of the first polishing slurry supplied to the polishing pad may be controlled. In some embodiments, the first polishing slurry volume supplied at the first table and/or the second polishing slurry volume is controlled based on the measured edge roll-off of the analyzed substrates. The polishing process may be controlled to adjust the edge roll-off in accordance with one or more of the methods disclosed in U.S. Patent Publication No. 2017/0178890, which is incorporated herein by reference for all relevant and consistent purposes.

In accordance with some embodiments of the present disclosure, to determine a pad-to-pad variance of the polishing pad, the edge roll-off of the first semiconductor substrate or batch of substrates is compared to an average edge roll-off of polishing pads of the same type as the polishing pad used to polish the first semiconductor substrate. The amount of the polishing slurry (e.g., first silica-containing slurry) supplied to the polishing pad while contacting the second semiconductor substrate with the polishing pad may be based on, at least in part, the difference between the measured edge roll-off of the first semiconductor substrate and the average edge roll-off of polishing pads of the same type. The average edge roll-off of the particular type of polishing pad may be determined from previous polishing runs using the same type of pads.

In embodiments in which the first polished semiconductor substrate(s) is analyzed by measuring the edge roll-off to determine the pad-to-pad variance of the polishing pad, the pad may be a new pad installed on the polishing table. The semiconductor structure(s) may be (ideally) the first semiconductor structure that is polished by the new pad or may be one of the first five, first ten or first twenty substrates polished by the new polishing pad. In embodiments in which a new polishing apparatus and/or pad arrangement is used, a number of wafers (e.g., first 50, 100, or 200 wafers) may be initially polished until stable removal is achieved, after which the first polished semiconductor substrate(s) referenced above may be analyzed by measuring the edge roll-off to determine the pad-to-pad variance of the polishing pad.

In some embodiments, a batch of substrates is analyzed by measuring the edge roll-off of each of the substrates to determine the pad-to-pad variance of the polishing pad (e.g., new pad) and adjust the polishing process. The batch may include at least 2 semiconductor substrates or, as in other embodiments, at least 5, at least 10, at least 15 or at least 20 semiconductor substrates. The measured edge roll-off of each of the polished semiconductor substrates may be averaged with the amount of the polishing slurry supplied to the polishing pad while contacting the second semiconductor substrate with the polishing pad being based on, at least in part, the averaged roll-off amount of the batch.

In some embodiments, a ratio of the first polishing slurry volume supplied at the first table to the second polishing slurry volume supplied at the first table is adjusted. As shown in Examples 2 and 4 below, by decreasing the amount of first silica-containing polishing slurry supplied relative to the second silica-containing slurry, the edge roll-off that occurs during the finish polish is reduced (i.e., a negative ROA which would indicate the presence of roll-off at the edge is made less negative). In instances in which the edge roll-off is expected to be greater (i.e., greater due to variation during manufacture of the pad) as predicted from the measured roll-off of analyzed structures, the amount of first silica-containing polishing slurry supplied relative to the second silica-containing slurry may be decreased to off-set the increase in edge roll-off due to pad-to-pad variability. In instances in which the edge roll-off is expected to be less (i.e., less due to variation during manufacture of the pad) as predicted from the measured roll-off of analyzed structures, the amount of first silica-containing polishing slurry supplied relative to the second silica-containing slurry may be increased to off-set the increase due to pad-to-pad variability.

In some embodiments, the ratio of the first slurry to the second slurry is adjusted by changing the length of time at which the first silica-containing slurry is supplied to the polishing pad and/or changing the amount of time the second silica-containing slurry is supplied to the polishing pad. For example, the total time at which the first and second slurries are applied may be kept constant with the time at which the first and second slurries are supplied to the pad being varied.

Alternatively or in addition to adjusting the ratio of the first and second silica-containing polishing slurries, the amount of the third alkaline polishing slurry added at the first table (i.e., the total sum of alkaline added at the first table during each polishing step) is adjusted based on the measured edge roll-off of the analyzed substrates. In some embodiments, the amount of the third alkaline polishing slurry added concurrently with the second silica-containing polishing slurry is controlled to adjust edge roll-off. As shown in Example 3 below, by increasing the amount of alkaline added during the first table of the finish polisher, the edge roll-off that occurs during the finish polish is reduced (i.e., a negative ROA which would indicate the presence of roll-off at the edge is made less negative). The amount of alkaline polishing slurry supplied at the first table of the finish polisher may be increased based on a measured increase in roll-off due to pad-to-pad variance or decreased based on a measured decrease in roll-off due to pad-to-pad variance.

In some embodiments, a target edge roll-off is determined and the process conditions (e.g., amount of first polishing slurry containing silica and/or the amount of alkaline third polishing slurry) are adjusted based on the pad-to-pad variance as determined from the edge roll-off of the analyzed structure(s). In addition to edge roll-off measurement, the feedback control methods may also involve evaluation of other parameters such as the wafer flatness and controlling the polishing parameters such that improved edge roll-off may be achieved without unacceptable degradation of the wafer flatness. Other parameters may be monitored to ensure quality processing (e.g., presence of etching pits).

Alternatively or in addition to controlling the amount of polishing slurry supplied to the polishing based on the edge roll-off of the first semiconductor substrate(s), the amount of polishing slurry subsequently used may be based on, at least in part, one or more other parameters related to the polishing process. For example, the amount of the polishing slurry supplied to the polishing pad while contacting the second semiconductor substrate with the polishing pad may be based on, at least in part, the lifetime of the polishing pad.

Figure 8:
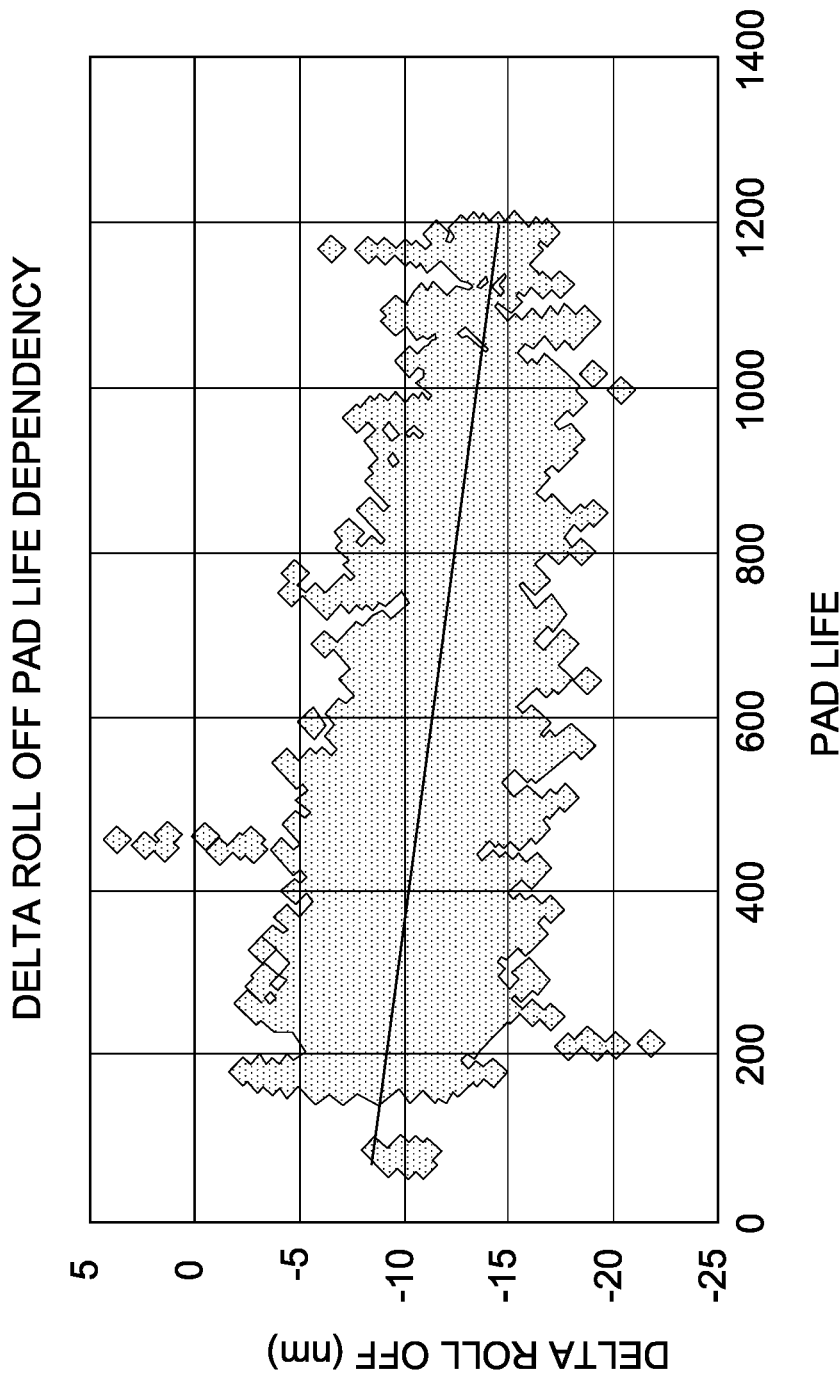
FIG. 8 is a graph of the change in the edge roll-off of finish polished wafers as pad lifetime varies.

The lifetime of the pad may be determined based on the number of substrates polished by the pad or the hours at which the pad has been used to polish substrates or by any other suitable method (e.g., accumulation of time multiplied by polishing pressure). The lifetime may be normalized to an average lifetime at which the pads are typically used or a predetermined lifetime after which the pad is replaced. As shown in FIG. 8, as the lifetime of the pad increases, the edge roll-off generally increases. By decreasing the amount of first silica-containing polishing slurry supplied, the edge roll-off that occurs during the finish polish may be reduced (i.e., a negative ROA which would indicate the presence of roll-off at the edge is made less negative) to off-set the increased edge roll-off due to increased lifetime of the pad. Alternatively, the amount of third slurry (i.e., alkaline slurry) may be adjusted.

Figure 9:
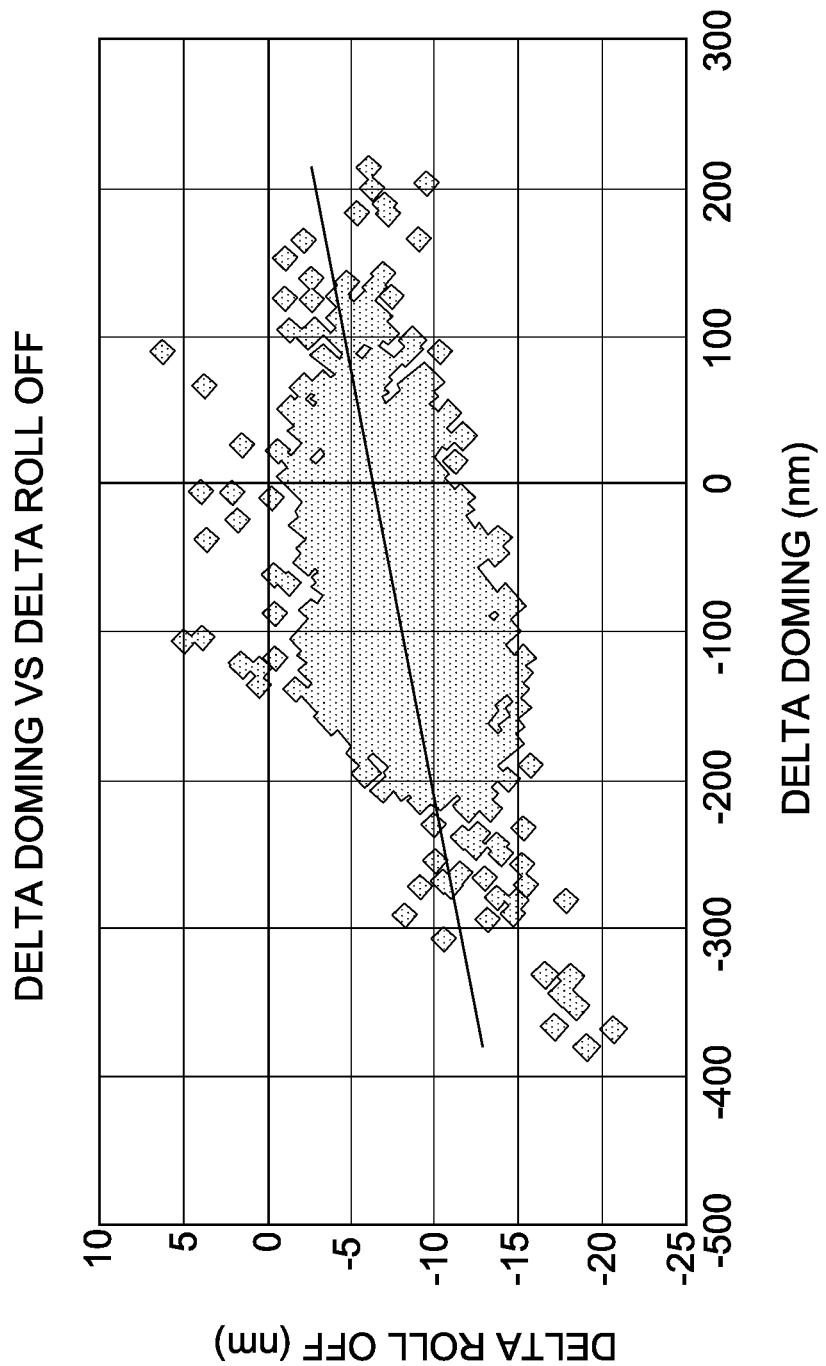
FIG. 9 is a graph of the change in the edge roll-off of finish polished wafers as the global flatness of the wafers varies.

In some embodiments, the polishing process is adjusted based on, at least in part, the measured flatness of the second semiconductor wafer. As shown in FIG. 9, an increase in doming (i.e., the thickness difference between the wafer center and edge area) causes an increase in the edge roll-off. This increase may be off-set by decreasing the amount of first silica-containing polishing slurry supplied to the pad (e.g., relative to the second silica-containing slurry), such that the edge roll-off that occurs during the finish polish may be reduced. Alternatively, the amount of alkaline slurry may be adjusted.

As compared to conventional methods for polishing substrates, methods of the present disclosure have several advantages. By measuring the edge roll-off of a first semiconductor substrate or batch of substrates after a new polishing pad has been installed on the polishing table, the pad-to-pad variation of the pad may be determined which allows the polishing process to be adjusted for subsequently polished substrates. Deviations from the average expected roll-off for the polishing pad may be offset dynamically within the finish polish sequence by reducing or increasing the amount of polishing slurry containing silica or an alkaline polishing slurry. Adjusting the polishing process to account for the impact on edge roll-off attributed to the lifetime of the polishing pad and/or the flatness of the semiconductor to be polished allows the polishing process to be further tuned to achieve a more consistent roll-off. The methods may be particularly useful to reduce the edge roll-off in single-side polishing processes in which no more than about 0.5 μm or less of material is removed from the surface of the structure (which is typical of polishing of 300 mm diameter wafers).

EXAMPLES

The processes of the present disclosure are further illustrated by the following Examples. These Examples should not be viewed in a limiting sense.

Example 1: Effect of Varying Amounts of First and Second Silica Slurries on Removal Profile in Finish Polish Rough, double-side polished wafers were finish polished in a single-side polisher. In a first polishing step of the first table of the final polishing apparatus, a first polishing slurry comprising silica particles (Syton-HT50) and an amount of alkaline polishing slurry (KOH) were supplied to the polishing pad. In a second step, a second polishing slurry comprising silica particles (mixture of Glanzox-3018 and NP 8020) and alkaline were supplied to the table. The second silica-containing slurry contained less silica than the first silica-containing slurry. In a third step, the second silica-containing slurry and deionized water were supplied to the pad.

The wafers were transferred to a second table and subsequently to a third table. In both the second and third tables, the second silica-containing polishing slurry and deionized water were supplied to the pads.

Figure 3:
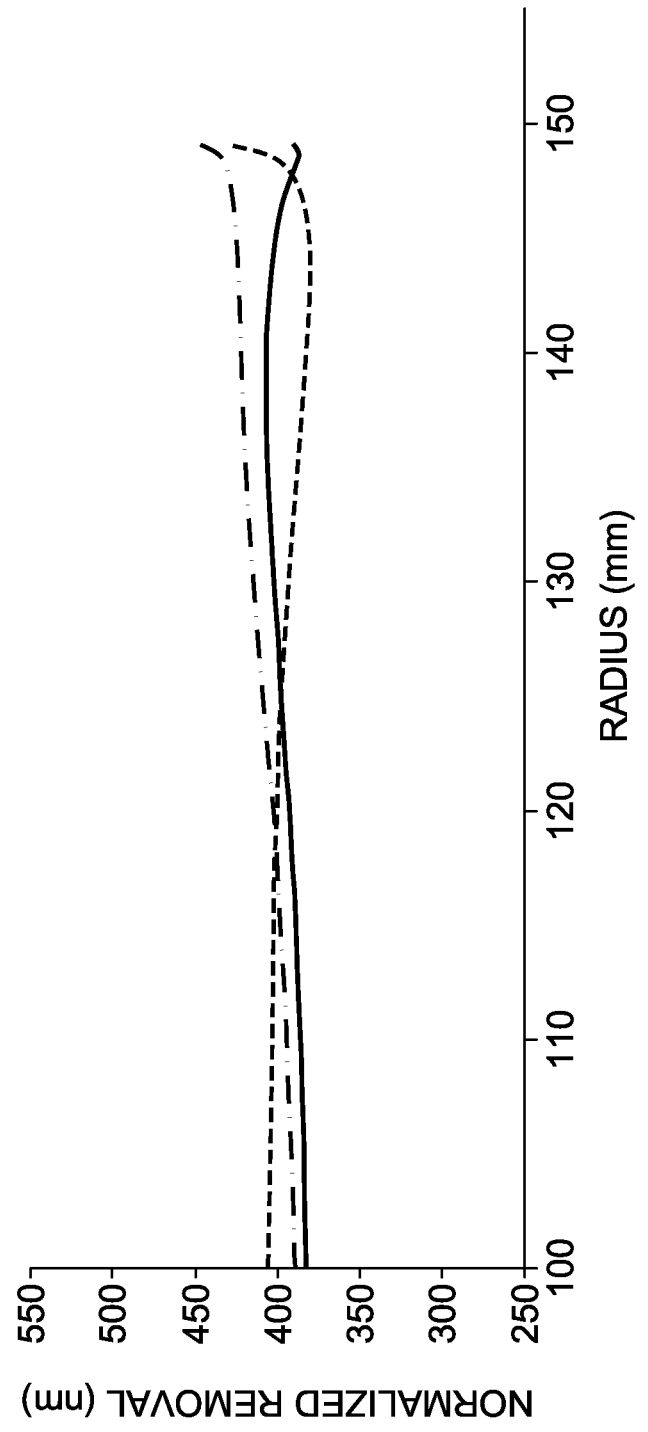
FIG. 3 is a graph of the change in the amount of material removed across the wafer radius for different finish polish conditions.

The amount of the first and second silica-containing slurries was varied from the conventional polishing method for several runs of wafers. Normalized removal for the various runs was measured after processing at the first, second and third tables. As shown in FIG. 3, use of additional first slurry resulted in an increase of removal at the edge (an increase in edge roll-off). Use of less first slurry also resulted in an increase in removal at the edge of the wafer. However, the change in removal (i.e., degree of removal near 148 mm as compared to a fitted line showing the change in removal toward the edge) was greater when additional first slurry was used which indicates a higher edge roll-off with increased first slurry. Use of additional second slurry resulted in less removal toward the edge of the wafer and reduced roll-off.

Example 2: Effect of Varying First Silica-Containing Slurry in Finish Polish

Figure 4:
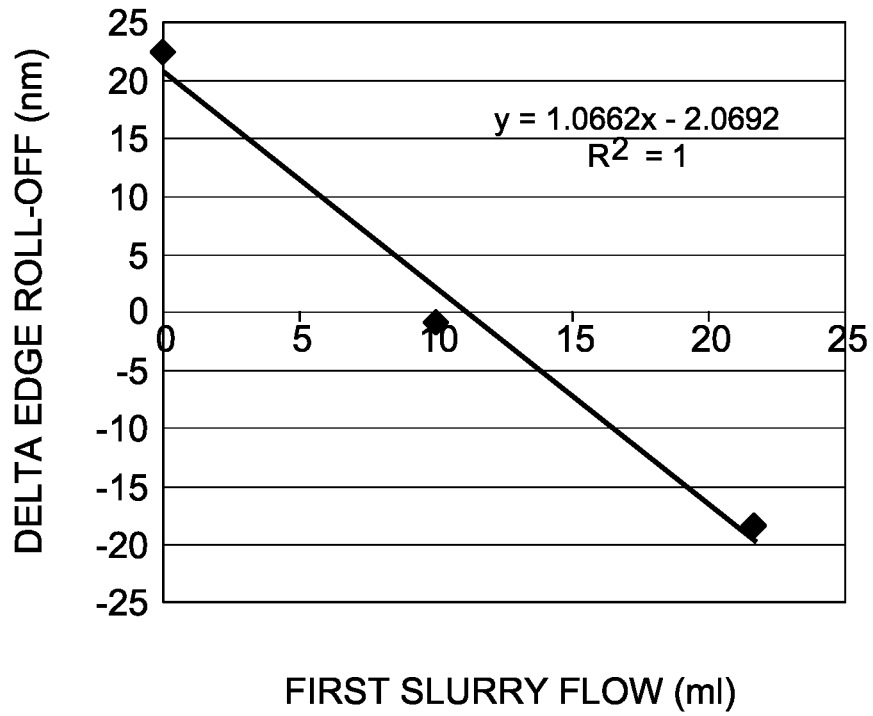
FIG. 4 is a graph of the change in the edge roll-off of finish polished wafers when varying the amount of the first silica-containing polishing slurry.

The polishing process of Example 1 was performed while adjusting the total flow of the first silica-containing polish at the first table of the finish polisher. FIG. 4 shows the change in edge roll-off (measured at 148 mm) before and after the finish polish (finish ROA minus rough ROA). As shown in FIG. 4, use of small volumes of the first silica containing polishing lessens the edge roll-off (i.e., negative ROA becomes less negative). This improvement lessens with additional volume of the first silica-containing polishing slurry. Volumes to the right of the intersection with the x-axis indicate an increase in edge roll-off caused by use of additional first slurry.

Figure 5:
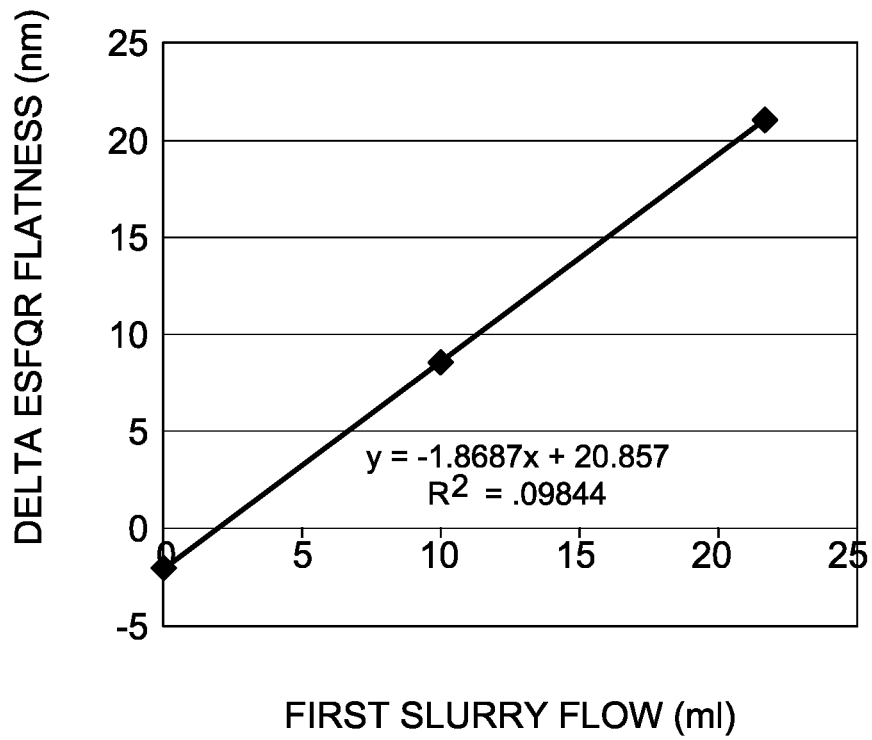
FIG. 5 is a graph of the change in the near edge flatness of finish polished wafers when varying the amount of the first silica-containing polishing slurry.

FIG. 5 shows the change in near-edge flatness (ESFQR) for the wafers. As shown in FIG. 5, the near-edge flatness degrades with use of additional volume of the first silica-containing polishing slurry at the first table of the finish polisher.

Example 3: Effect of Varying Amount of Alkaline in Finish Polish

The ratio of the amount of alkaline to the amount of second silica containing slurry in the second polishing step of the first table of the finish process described in Example 1 was varied. The edge roll-off (measured at 148 mm) of the wafers were measured after the finish polish.

Figure 6:
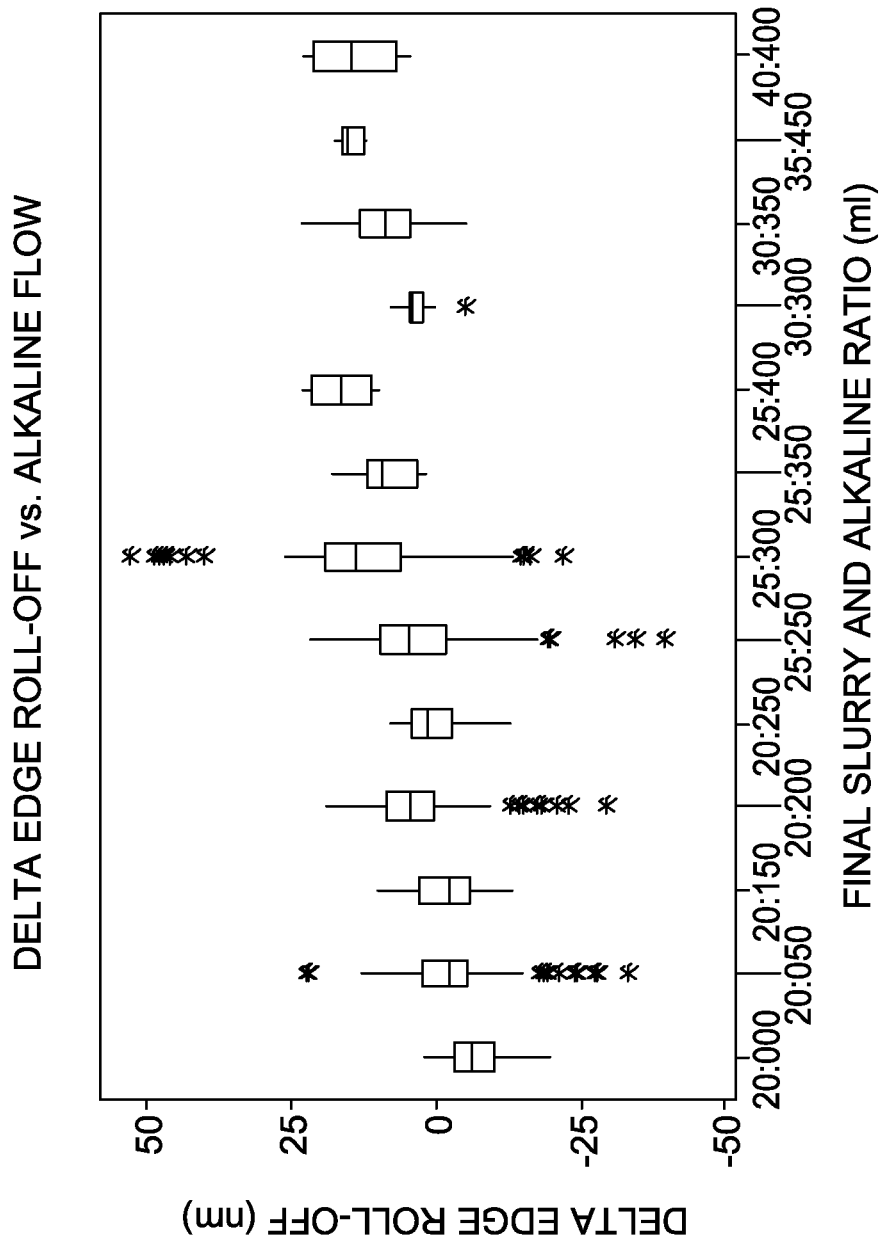
FIG. 6 is a box-plot of the change in the edge roll-off of finish polished wafers when varying the amount of alkaline polishing slurry.

A box-plot of the results is shown in FIG. 6. As shown in FIG. 6, at a second silica-containing slurry amount of 20 ml (first 5 data points), the edge roll-off improved with increasing amounts of alkaline. This is also seen in the 25 ml second silica-containing slurry data points.

Example 4: Effect of Varying Time of First and Second Silica Slurries on Removal Profile in Finish Polish Rough, double-side polished wafers were finish polished in a single-side polisher. In a first polishing step of the first table of the final polishing apparatus, a first polishing slurry comprising silica particles (DVSTS029 from Nalco) and an amount of alkaline polishing slurry (KOH) were supplied to the polishing pad. In a second step, a second polishing slurry comprising silica particles (NP 8020H from Nitta Haas) and alkaline were supplied to the table. The second silica-containing slurry contained less silica than the first silica-containing slurry. The relative feed rates in the first and second steps is shown in Table 1 below.

TABLE 1

Rates of First and Second Silica Slurries and of Alkaline During First and Second Steps of First Table (X + Y = 35 seconds)

|  | Step 1 | Step 2 |
|---|---|---|
| Duration | X | Y |
| Nalco | 20 cc/min | — |
| KOH | 600 cc/min | 600 cc/min |
| NP8020H | — | 35 cc/min |

In a third step, the second silica-containing slurry and deionized water were supplied to the pad.

Figure 7:
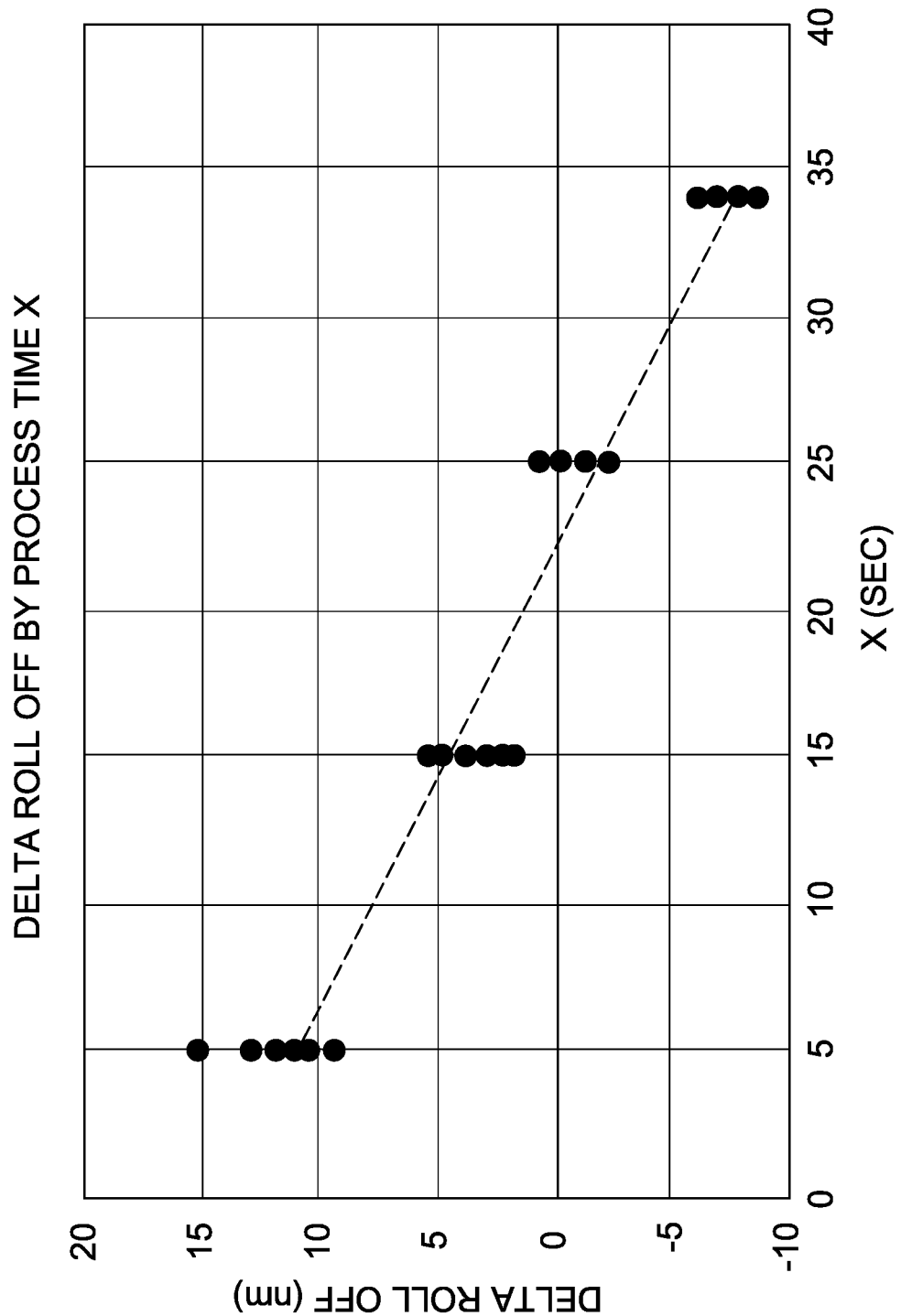
FIG. 7 is a graph of the change in the edge roll-off of finish polished wafers when varying the time at which a first silica-containing polishing slurry and a second silica-containing polishing slurry are supplied.

The total polishing time for step 1 and step 2 was kept constant at 35 seconds. The amount of time of step 1 ("X") and step 2 ("Y") were varied with the change in edge roll-off being shown in FIG. 7. As shown in FIG. 7, increasing the time of the first polishing step caused the roll-off to increase (i.e., negative ROA becomes more negative).

Example 5: Effect of Pad Lifetime on Edge Roll-Off

FIG. 8 shows the change in edge roll-off before and after finish polishing as the pad lifetime increases with the normalized lifetime being shown. As can be seen from FIG. 8, the edge roll-off increases (i.e., becomes more negative) as the lifetime of the pad increases.

Example 6: Effect of Wafer Flatness on Edge Roll-Off

The doming of a wafer (i.e., change in thickness between the center and edge with positing parameters resulting in a domed wafer and negative numbers resulting in a dished wafer) was measured before and after finish polishing ("Delta Doming") and the edge roll-off of the wafers was measured before and after finish polishing ("Delta Roll Off"). FIG. 9 shows the change in roll-off as a function of the change in delta doming. As shown in FIG. 9, an increase in delta doming results in reduced edge roll-off (i.e., a negative edge roll-off becomes less negative).

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for polishing semiconductor substrates, each substrate having a front surface and a back surface generally parallel to the front surface, the method comprising:
contacting the front surface of a first semiconductor substrate with a polishing pad;
supplying a first semiconductor substrate polishing slurry to the polishing pad to finish polish the front surface of the first semiconductor substrate and produce a polished first semiconductor substrate;
measuring the edge roll-off of the first semiconductor substrate;
contacting the front surface of a second semiconductor substrate with the polishing pad;
supplying a second semiconductor substrate polishing slurry to the polishing pad to finish polish the front surface of the second semiconductor substrate; and
controlling an amount of the second semiconductor substrate polishing slurry supplied to the polishing pad while contacting the second semiconductor substrate with the polishing pad based on, at least in part, the measured edge roll-off of the first semiconductor substrate.

2. The method as set forth in claim 1 wherein the first semiconductor substrate is one of a batch of semiconductor substrates, the method comprising:
contacting the front surface of each semiconductor substrate of the batch of semiconductor substrates with the polishing pad;
supplying the first semiconductor substrate polishing slurry to the polishing pad for each semiconductor substrate of the batch to finish polish the front surface of each of the semiconductor substrates of the batch to produce a batch of polished semiconductor substrates;
measuring the edge roll-off of each of the polished semiconductor substrates of the batch; and
controlling the amount of the second semiconductor substrate polishing slurry supplied to the polishing pad while contacting the second semiconductor substrate with the polishing pad based on, at least in part, the measured edge roll-off of the batch of polished semiconductor substrates.

3. The method as set forth in claim 2 wherein the measured edge roll-off of each of the polished semiconductor substrates of the batch is averaged, the amount of the second semiconductor substrate polishing slurry supplied to the polishing pad while contacting the second semiconductor substrate with the polishing pad being based on, at least in part, the averaged roll-off amount of the batch.

4. The method as set forth in claim 3 further comprising comparing the average edge roll-off of the batch of semiconductor substrates to an average edge roll-off of polishing pads that are the same as the polishing pad used to polish the first semiconductor substrate to determine a pad-to-pad variance of the polishing pad.

5. The method as set forth in claim 2 wherein the batch comprises at least 5 semiconductor substrates.

6. The method as set forth in claim 1 wherein the amount of the second semiconductor substrate polishing slurry supplied to the polishing pad while contacting the second semiconductor substrate with the polishing pad is controlled based on, at least in part, the lifetime of the polishing pad.

7. The method as set forth in claim 1 wherein the amount of the second semiconductor substrate polishing slurry supplied to the polishing pad while contacting the second semiconductor substrate with the polishing pad is controlled based on, at least in part, the flatness of the second semiconductor substrate.

8. The method as set forth in claim 1 wherein the second semiconductor substrate polishing slurry is supplied in at least two steps, the second semiconductor substrate polishing slurry being a first step polishing slurry comprising silica, the first step polishing slurry being supplied to the polishing pad at a first step polishing slurry volume, the method further comprising:
supplying a second step polishing slurry to the polishing pad at a second step polishing slurry volume, the first step polishing slurry comprising a higher concentration of silica relative to the second step polishing slurry, wherein the amount of the first step polishing slurry supplied to the polishing pad is controlled by controlling a ratio of the first step polishing slurry volume to the second step polishing slurry volume.

9. The method as set forth in claim 8 wherein the second step polishing slurry comprises silica.

10. The method as set forth in claim 8 wherein the ratio of the first step polishing slurry volume to the second step polishing slurry volume is controlled by controlling the time at which the first step polishing slurry and second step polishing slurry are applied to the polishing pad.

11. The method as set forth in claim 8 wherein the first step polishing slurry and the second step polishing slurry are separately supplied to the polishing pad.

12. The method as set forth in claim 1 wherein the amount of second semiconductor polishing slurry supplied to the polishing pad is the total amount of second semiconductor polishing slurry supplied while polishing at a first table of a polishing apparatus, the method comprising transferring the substrate to a second table of the polishing apparatus.

13. The method as set forth in claim 1 wherein the back surfaces of the first and second semiconductor substrates are not contacted with a polishing pad while polishing the front surface of the substrate.

14. The method as set forth in claim 1 wherein:
the finish polish of the first semiconductor substrate removes about 0.5 µm or less of material from the front surface of the first semiconductor substrate; and
the finish polish of the second semiconductor substrate removes about 0.5 µm or less of material from the front surface of the second semiconductor substrate.

15. The method as set forth in claim 1 wherein the first semiconductor substrate is one of the first five, first ten or first twenty substrates polished by the polishing pad.

16. The method as set forth in claim 1 wherein the first semiconductor substrate is the first substrate polished by the polishing pad.

17. The method as set forth in claim 1 wherein the amount of the second semiconductor substrate polishing slurry supplied to the polishing pad while contacting the second semiconductor substrate with the polishing pad is based on, at least in part, the difference between the measured edge roll-off of the first semiconductor substrate and the average edge roll-off of the same polishing pads.

* * * * *